(12) United States Patent
Falk et al.

(10) Patent No.: US 7,091,411 B2
(45) Date of Patent: Aug. 15, 2006

(54) MULTICRYSTALLINE LASER-CRYSTALLIZED SILICON THIN LAYER SOLAR CELL DEPOSITED ON A GLASS SUBSTRATE AND METHOD OF PRODUCING

(75) Inventors: Fritz Falk, Jena (DE); Gudrun Andrae, Jena (DE)

(73) Assignee: Institut fur Physikalische Hochtechnologie e.V., Jena (DE)

( * ) Notice: Subject to any disclaimer, the term of this patent is extended or adjusted under 35 U.S.C. 154(b) by 711 days.

(21) Appl. No.: 10/344,910

(22) PCT Filed: Aug. 20, 2001

(86) PCT No.: PCT/EP01/09571

§ 371 (c)(1),
(2), (4) Date: Feb. 18, 2003

(87) PCT Pub. No.: WO02/19437

PCT Pub. Date: Mar. 7, 2002

(65) Prior Publication Data

US 2003/0183270 A1 Oct. 2, 2003

(30) Foreign Application Priority Data

Aug. 31, 2000 (DE) .............................. 100 42 733

(51) Int. Cl.
*H01L 31/0392* (2006.01)
*H01L 31/0368* (2006.01)
(52) U.S. Cl. .......................... 136/258; 136/261; 438/97
(58) Field of Classification Search ................ 136/258, 136/261
See application file for complete search history.

(56) References Cited

U.S. PATENT DOCUMENTS

| 4,330,363 A | 5/1982 | Biegesen et al. ........... 156/620 |
| 4,620,058 A * | 10/1986 | Winterling et al. ......... 136/258 |
| 4,665,278 A | 5/1987 | Takada et al. .............. 136/256 |

FOREIGN PATENT DOCUMENTS

| DE | 198 25 635 | 12/1999 |
| WO | 81/01914 | 7/1981 |

OTHER PUBLICATIONS

Bergmann et al., Crystalline Silicon Films by Chemical Vapor Deposition on Glass for Thin Film Solar Cells, IEEE 25th PVSC May 13-17, 1996; Washington D.C., pp. 365-370.*

(Continued)

*Primary Examiner*—Nam Nguyen
*Assistant Examiner*—Anthony Fick
(74) *Attorney, Agent, or Firm*—Quarles & Brady LLP

(57) ABSTRACT

The invention relates to a multicrystalline laser-crystallized silicon thin layer solar cell deposited on a glass substrate (a), which is configured for illuminating from the substrate side, and to a production method for the cell. Said solar cell comprises a laser-crystallized multicrystalline silicon layer (b1, b2), whose lower layer region (b1), which is situated on the substrate (a) and provided as a nucleation layer and, at the same time, as a lower transparent electrode, is p-doped (alternatively, n-doped). The silicon layer's second layer region (b2), which faces away from the substrate is p-doped (alternatively, n-doped) less than the nucleation layer and serves as an absorber layer. The edge lengths of the crystallites in the multicrystalline layer (b1, b2) are longer than the layer is thick. The inventive solar cell also comprises a laser-crystallized, n-doped (alternatively, p-doped) silicon layer (c), which is located on the silicon layer (b1, b2) and which serves as an emitter layer, and comprises a back-reflecting contact layer (A1) that serves as an upper electrode on the emitter layer (c).

24 Claims, 1 Drawing Sheet

OTHER PUBLICATIONS

Figure 1:
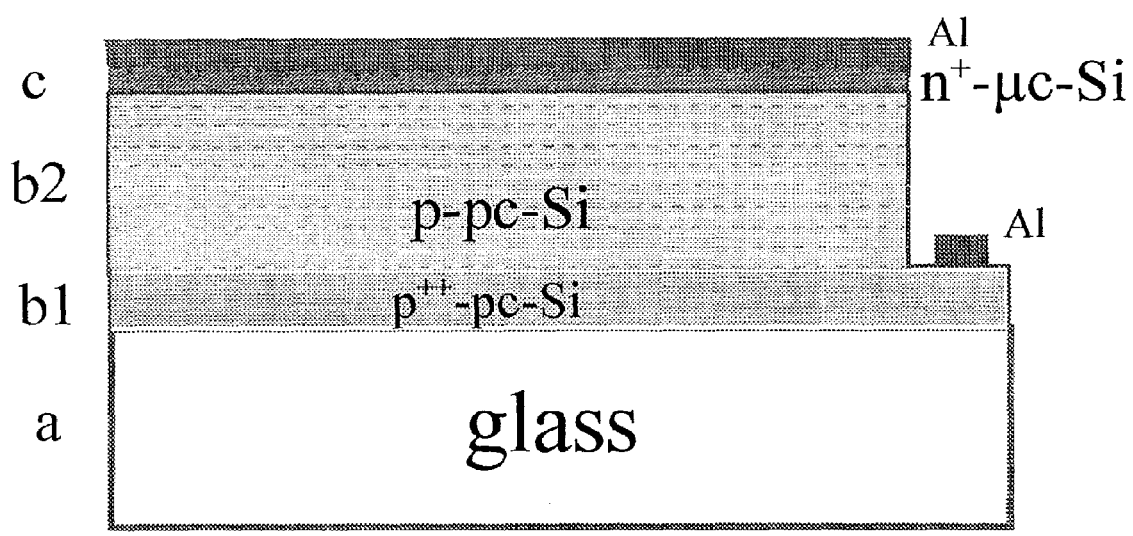

Andra, G., Bergmann, J., Falk, F., and Ose, E., Preparation of Thick Polycrystalline Silicon Layers on Glass by Laser Irradiation, Thin Solid Films, 318, 1998, pp. 42-45.*

Bergmann R B et al "Crystalline Silicon Films by Chemical Vapor Deposition on Glass for Thin Film Solar Cells" Conference Record of the 25th IEEE Photovoltaic Specialists Conference 1996. Washington, May 13-17, 1996, Conference Record of the IEEE Photovoltaic Specialists Conference, New York, IEEE, US; vol. Conf. 25, May 13, 1996, pp. 365-370; XP000896927; ISBN: 0-7803-3167-2; p. 365-368.

Andra G et al: "Preparation of thick polycrystalline silicon layers on glass by laser irradiation" Thin Solid Films, Elsevier-Sequoia S.A. Lausanne, CH, vol. 318, No. 1-2, Apr. 15, 1998; pp. 42-45; XP004138560; ISSN: 0040-6090.

R.B. Bergmann et al: "High rate, low temperature deposition of crystalline silicon films for thin film solar cells on glass" $2^{ND}$ World Conference on Photovoltaic Solar Energy Conversion, vol. II, Jul. 6-10, 1998, pp. 1260-1265; XP002189120; Vienna; AT.

Kohler Jr et al: "Large-grained polycrystalline silicon on glass by copper vapor laser annealing" Thin Solid Films, Elsevier-Sequoia S.A. Luasanne, CH, vol. 337, No. 1-2, Jan. 11, 1999; pp. 129-132; XP004197113; ISSN: 0040-6090.

Andra G et al: "Laser induced crystallization: a method for preparing silicon thin film solar cells" Conference Record of the $26^{TH}$ IEEE Photovoltaic Specialists Conference, 1997. PVSC '97. Anaheim, CA, Sep. 29-Oct. 3, 1997; IEEE Photovoltaic Specialists Conference, New York, NY: IEEE, U.S., Sep. 29, 1997; pp. 639-642; XP010267866; ISBN: 0-7803-3767-0.

G. Andra et al: "Preparation of single crystalline regions in amorphous silicon layers on glass by Art laser irradiation" Applied Surface Science, vol. 154-155, Feb. 2000; pp. 123-129; XP001059803; Amsterdam, NL.

Patent Abstracts of Japan; vol. 1999, No. 1, Dec. 22, 1999 & JP 11 251611 A (Kyocera corp), Sep. 17, 1999.

Patent Abstracts of Japan, 07094766, date of publication is Apr. 7, 1995.

Patent Abstracts of Japan, 11186585, date of publication is Jul. 9, 1999.

Patent Abstracts of Japan, 11251611, date of publication is Sep. 17, 1999.

Patent Abstracts of Japan, 11274536, date of publication is Oct. 8, 1999.

* cited by examiner

MULTICRYSTALLINE LASER-CRYSTALLIZED SILICON THIN LAYER SOLAR CELL DEPOSITED ON A GLASS SUBSTRATE AND METHOD OF PRODUCING

The present invention relates to a multicrystalline laser-crystallized silicon thin film solar cell deposited on a glass substrate, which is configured for illumination from the substrate side. A multicrystalline laser-crystallized silicon thin film solar cell is in contrast to amorphous silicon thin film solar cells (WO 81/01914). The expected advantages of large crystals being typical for multicrystalline silicon thin film solar cells, namely a high cell efficiency exceeding 15% combined with a low quantity of silicon material required and smallest possible layer thicknesses, have been well known for a long time to those skilled in the art. Nevertheless, solar cells of this type on a glass substrate which endures temperatures of only 600° C. or 700° C. at the most, have not been described. The mentioned high efficiencies have been achieved in multicrystalline thin film silicon solar cells deposited on high temperature resistant substrates which are non-transparent. An example of a multicrystalline cell of this type designed for illumination from the side opposite to the substrate has been described in "18.2% Efficient Multicrystalline Silicon Cell", Jianhua Zhao et al., 26$^{th}$ PVSC, Sep. 1997, Anaheim, Calif. The crystal dimensions in the multicrystalline wafer structure as described range from 0.1 mm$^2$ to 1 cm$^2$.

Glass substrates and illumination from the substrate side are desirable since a large area metal electrode being easily produced can be applied on the side opposite to the substrate. For achieving an illumination from the substrate side, transparent conductive oxide (TCO) layers have been used as a counter electrode on the glass substrate in solar cells implemented up to now. These transparent conductive oxide (TCO) layers suffer from enduring merely low temperatures (less than 300° C.) in the cell preparation process. A cell design of this type has been described, for example, in U.S. Pat. No. 4,665,278 with amorphous or microcrystalline (μc) silicon as base material. A particular aspect of this cell design is that the metal electrode provided on the opposite side of the substrate serves as a flat back reflector.

The efficiency of commercially produced amorphous silicon solar cell modules which, as known, can be manufactured at low cost, amounts to only about 8%. In so-called microcrystalline silicon solar cells having a silicon layer of fine crystallites with amorphous components (μc-Si:H cells), an illumination from the substrate side is possible in principle though these cells are normally operated with light incident from an upper side opposite to the substrate. A disadvantage of the microcrystalline cell structure is that the large amount of grain boundaries have bad electrical properties. This limits the efficiency of the cells. Maximum efficiencies for microcrystalline laboratory cells at present amount to about 12%.

To avoid the described drawback, according to JP 11-186 585 (PAJ-Abstract), the silicon layers have been grown onto a glass substrate such that, as well known, an immediate deposition of finely grained silicon occurs, which finely grained silicon, however, shows a columnar structure. Though grain boundaries existing in large number are oriented in the direction of the current, it has to be noticed that they are in low distance form one another leading to bad electrical properties which, in the final analysis, limit the efficiency. The obtained uniform orientation of the crystallites in the textured layer seems to be beneficial for the efficiency. Preparation of textured layers with a preferential orientation of the crystallites has also been described in JP 7-94 766 A. This document discloses a particular microcrystalline silicon layer system on glass provided above an antireflection coating, namely a system comprising four layers p$^+$,p,n,n$^+$ or n$^+$,p,p$^+$, respectively, and three layer systems p$^+$,n,n$^+$ or n$^+$,p,p$^+$, in which a large area electrode is on top of the layer stack or system. The individual layers are deposited to be 20 nm to maximum 500 nm thick and laser-crystallized by a pulsed UV laser to produce a uniform crystal orientation. Grain sizes exceeding 50 nm were reported. One, however, has to be aware that, as is well known, crystallization by pulsed UV lasers leads to grains which are always below 1 μm in size. Furthermore, it is pointed out therein that epitaxial growth is not required and that, hence, the temperature during deposition may be reduced. The layer structures disclosed in said document have not been mentioned in further publications of the same authors dealing with p$^+$,p,n$^+$ or pin structures and with columnar growth.

To avoid the above described drawbacks larger crystals may be produced by direct deposition. This, however, requires temperatures which are so high that glass substrates cannot be used. As a further possibility there exists the rather intricate method to produce cells by transfer of quasi-monocrystalline silicon layers onto glass or plastics substrates and thus allowing for illumination from the substrate side. To this end a silicon layer separated from a wafer is, together with an electrode film, glued to a substrate.

A review on the present various types of crystalline thin film silicon cells is given by "Crystalline Si thin-film solar cells: a review", R. B. Bergmann, Appl. Phys. Lett. A 69 (1999), pp. 187–194. This paper states as well that high efficiency can only be achieved either by rather thick cells made from silicon wafers or by the mentioned quasi-monocrystalline silicon layers, with the additional drawback that the cell size is restricted to the wafer size. Furthermore, it is stated therein that the desired multicrystalline silicon with the large crystallites would have been successfully produced only on high temperature resistant substrates in case one tried to achieve comparably high efficiency values.

In "Preparation of single crystalline regions in amorphous silicon layers on glass by Ar$^+$ laser irradiation", G. Andrä, et al., Appl. Surface Science 154–155 (2000), pp. 123–129, a method for preparing large crystallites in silicon layers even on glass substrates useful for solar cells and, for example, for microelectronics has been described. In this method an amorphous silicon layer is irradiated by an Ar$^+$ laser. Grains exceeding 100 μm in size have been successfully produced by means of laser crystallization in the a-Si:H layers using an overlapping laser irradiation described in this paper. In "Preparation of thick polycrystalline silicon layers on glass by laser irradiation", G. Andrä et al., Thin Solid Films 318 (1998), pp. 42–50, it is furthermore stated that, after having applied a large grained crystalline seed layer by crystallization of an amorphous layer using an Ar$^+$ laser the thickness of this seed layer could be increased without altering the lateral size of the crystallites. This increase could be achieved using a pulsed excimer laser irradiation during the further deposition. This method principally allows to produce grains over 10 μm to 100 μm in size, which are larger than the minimum layer thickness required for a thin film silicon solar cell. For microelectronics in particular a laser crystallization method is described in DE 198 25 635 C1 producing grains of diameters larger than 1 μm by irradiation with short pulse lasers such as the copper vapor laser or the frequency doubled Nd:YAG laser. Uniform grain sizes exceeding 10 µm distinctly as are desirable for solar cells can not be produced by this last mentioned method.

The object underlying the present invention is to provide a multicrystalline silicon thin film solar cell on glass showing such large grain sizes and being configured for illumination from the glass substrate side. Furthermore, a method for producing such a solar cell is to be provided.

This object is solved by the subject matter of the independent claims. Advantageous further developments are defined in the subclaims.

The inventional solar cell comprises by means of its seed layer as claimed a transparent electrode at the illuminated side of the cell which seed layer is made from the same material, namely from multicrystalline laser-crystallized silicon of large crystallites, as the absorber layer being the layer subsequent to the seed layer. The crystallites show a lateral size, i.e. an extension in the substrate's plane, exceeding the thickness of the multcrystalline silicon layer consisting of the seed layer, of the absorber layer and, optionally, of the emitter layer. Hence, the lateral size or dimension, in general, is distinctly larger than 10 µm. Perpendicular to the substrate, the grains of the seed layer extend throughout the absorber layer, and, in several cases, through the emitter layer as well. Hence, the crystallites have a size corresponding to the total thickness of said layers. The crystallites are not required to have a particular or preferential orientation in direction of thickness which simplifies the production process.

While the seed and the absorber layers in any case consist of multicrystalline silicon the emitter layer may consist of the same multicrystalline silicon or of microcrystalline silicon with grains preferably ranging from 5 to 500 nm in size. Due to the grainy structure of the absorber layer, the surface of the emitter layer being provided thereon and being providable with comparably low thickness is rough as well. In case of a microcrystalline emitter layer its surface roughness is even higher due to its fine grained structure. In this manner absorber layer, emitter layer and a reflecting contact layer (preferably a metal layer) applied thereon form a light trapping structure.

These features are new and favorable as compared to the known multicrystalline and also to the fine grained silicon cells. The seed layer acting simultaneously as an electrode can be located directly on the glass substrate being formed e.g. from borosilicate glass, which is in contrast the known cells. In this manner, a cell is provided which may be easily manufactured, and which, due to the large grains or crystallites and due to the inherent light trapping structure, gives the possibility of implementing high efficiencies. As compared to the mentioned known multicrystalline cells, the costs for material and for production are reduced. The cell may be produced as large area cell since glass substrates are available in any size desired.

In "High rate, low temperature deposition of crystalline silicon films for thin film solar cells on glass", R. B. Bergmann et al., $2^{nd}$ World Conference and Exhibition on Photovoltaic Solar Energy Conversion, $6^{th}$ to $10^{th}$ Jul. 1998, Vienna, pp. 1260–1265, a layer structure for a simulation cell comprising a highly p-doped laser crystallized seed layer on a glass substrate has been described. The seed layer, however, is part of a cell with illumination from the side opposite to the glass substrate and with a light reflecting layer on the lower glass substrate side. The emitter layer to be illuminated and being provided on a p-doped polycrystalline absorber layer, is, accordingly, ultra thin and consists of an amorphous silicon layer. Moreover, light trapping is achieved by a textured surface on the illuminated side of the cell. In this cell, the polycrystalline absorber layer is grown by epitaxial ion assisted deposition (IAD) on top of the microcrystalline or polycrystalline seed layer. The seed layer is produced by laser crystallization using a pulsed copper vapor laser to form crystallites with elongated grain structures several 10 µm long and a few µm wide. Said simulation cells having the disclosed layered structure are obviously designed according to a cell scheme, also disclosed in said paper, in which a non-continuous or structured front contact is provided at the illumination side of the cell and a continuous or full area back contact is provided at the glass substrate side.

In contrast to implemented cells with illumination from the glass substrate side as described elsewhere, a TCO layer is avoided in the cell according to the present invention. The seed layer which, instead, is directly provided on the glass substrate in form of a transparent silicon electrode not only serves allowing for temperatures of more than 1000° C. occurring during laser crystallization necessary for producing large grains. TCO would never withstand such temperatures. In addition to this purpose, the seed layer also acts as a transparent electrode for the cell.

Furthermore, the seed layer, regarding its electrode function, behaves as the TCO and makes it possible to use standard electrode material with low melting point such as aluminum or silver as material to be applied on the surface area opposite to the substrate. In this respect, it has to be noted that this upper electrode must not exhibit a particular high temperature resistance. This is an appreciable advantage since these metals are almost perfect reflectors for sun light.

Using the glass substrate one achieves a cheaper cell as compared with high temperature resistant substrates which are remarkably more expensive as glass. A costly intermediate layer between glass and crystalline silicon layer, such as a metal electrode or a buffer layer serving as a diffusion barrier with regard to foreign atoms originating from the glass substrate, is not necessary but possible. This also holds true for an antireflection coating.

Preferably, a standard borosilicate glass (e.g. Corning 7059 or borofloat of Schott) is used and the boron inherently contained in said glass is used for the doping of the seed layer or absorber layer or at least for part of the doping. In other words, the inventional cell not only avoids any diffusion barriers vis-a-vis the substrate, but specifically makes even use of the otherwise undesired doping material of the glass. For an alternative cell concept with n-doped absorber layer a substrate containing phosphorus instead of boron may be used.

The production process for the cells according to the present invention defined in the claims is a fast one and may be performed at low cost. The laser process applied during layer deposition does not damage the glass substrate. Furthermore, the high temperatures above the melting point of silicon, which are required for the growth of large silicon crystallites, and the required heating periods can be applied as well. Particularly, if the doping of seed layer and of absorber layer is performed totally or partially from the substrate used as source for providing dopand atoms during laser irradiation, no intricate or sophisticated parameters concerning doping have to be complied With. For the seed, absorber, and the emitter layers the same deposition processes can be used with only different laser treatment paramenters.

According to the present invention, a multicrystalline silicon solar cell can be prepared directly on a glass substrate enduring only limited temperature by means of a combined or simultaneous deposition of silicon and laser crystallization. The cell is thus formed with a minimum of layers having different material. Special high temperature resistant glass is not required as a substrate. Neither a temperature resistant electrode layer nor a diffusion barrier layer against foreign glass particles has to be applied to the glass. In contrast to other conventional thin film solar cell concepts no lateral doping profiles are necessary. Furthermore, the natural surface roughness due to the process provides in combination with the electrode layer a light trapping effect.

In the following, the present invention is further described referring to the Figure. FIG. 1 shows a schematic representation of an embodiment of the cell according to the present invention. On a flat or structured glass substrate containing dopands, preferably, a borosilicate glass containing 15 wt % boron oxide, there is provided a laser-crystallized multicrystalline silicon layer b ("pc" in the drawing means multicrystalline) with a thickness in the range of 2 μm to a preferred maximum of about 30 μm. The glass substrate may be roughed itself for producing a light trapping effect. In contrast thereto, JP 11-274 536 A provides an additional fine grained layer on the glass substrate for this purpose. Generally, the crystallites of layer b have a lateral (edge) size exceeding the respective layer thickness, and the grain boundaries of the crystallites thus extend throughout layer b from the glass substrate to the surface. The lower region b1 of this layer b provided directly adjacent to the glass substrate with a preferable thickness between 150 nm and 1.5 μm is highly p-doped ($10^{18}$ to $6 \times 10^{20}$ $cm^{-3}$, preferably more than $10^{19}$ $cm^{-3}$ dopand atoms) and acts as a transparent, highly conductive electrode and as a seed layer as well. This electrode layer is, according to the Figure, locally contacted, preferably with aluminum strips Al. Such contact means are principally known from other cells, e.g. JP 11-251 611 A (PAJ abstract).

On top of the seed layer there is layer region b2 which is less p-doped ($10^{15}$ to $10^{18}$ $cm^{-3}$ dopand atoms) and serves as absorber layer. The absorber layer b2 has a thickness between 1 μm and 30 μm and a dopand concentration which is homogeneous or gradually decreases with increasing distance from the layer boundary or interface to the seed layer b1. The doping of the absorber layer b2 is less than that of the seed layer b1. The dopand concentration in the absorber layer should, at the boundary to the emitter layer c, preferably have a value being at least 100 times lower than the value in the seed layer b1. On the multicrystalline absorber layer b2 there is provided a preferably highly n-doped emitter layer c having a thickness of 5 to 100 nm and being throughout laser crystallized with a uniform crystal structure, which means a continuously extended crystal structure, or with a fine crystalline structure consisting of fine grains or crystallites with grain sizes from 5 to 500 nm, preferably 20 to 500 nm. The emitter layer may be, however without any advantage, be thicker. The doping of the emitter layer c is in the range from $10^{18}$ to $2 \times 10^{21}$ $cm^{-3}$ dopand atoms, preferably exceeding $10^{19}$ $cm^{-3}$ and preferably consisting of phosphorus. On top of the emitter layer there is provided a metal electrode layer Al made of aluminum or alternatively of silver, which, in contrast to U.S. Pat. No. 4,665,278 where a simple reflector is described, acts as a structured or diffuse reflector of the above mentioned light trapping structure. The light trapping effect is achieved by the roughness of the interface or boundary between silicon and metal. The cell is illuminated from the glass substrate side.

The mentioned values of the thickness of the individual layers, are not, particularly as concerning the upper values, mandatory. Certainly, the cell's efficiency will not increase if the thickness exceeds the indicated values—apart from the fact that material consumption unnecessarily increases. It is even to be expected that the current yield will decrease in this case. The thickness of the multicrystalline layer should not be lower than 2 μm. Hence, if the seed layer is only 150 nm thick then the thickness of the absorber layer should not be at the lower limit of 1 μm but should be accordingly higher.

As an alternative to the described cell design: substrate/$p^+$ (seed layer)/p (absorber)/$n^+$ (emitter)/reflector the following cell design is also possible: substrate/$n^+$ (seed layer)/n (absorber)/$p^+$ (emitter)/reflector. On a flat or structured glass, containing alternatively n-doping components, preferably phosphorus, this cell has the same structure despite of the doping layout and distribution. In this alternative case, there is a highly n-doped seed layer at the glass side of the cell, the absorber is slightly n-doped, then comes a higher p-doped emitter on which the reflector is provided which simultaneously acts as upper electrode. If diffusion from the glass is avoided by a barrier layer (buffer) then the alternative design $p^+$, n, $n^+$ or $n^+$, p, $p^+$ can be implemented, too. This alternative, however, is not favored according to the present invention.

The cell can, for example, be manufactured in the following way: Onto a flat or a structured boron containing glass (for the alternative design phosphorus containing glass), an amorphous silicon layer 150 nm to 1.5 μm thick is deposited using a known method such as plasma enhanced CVD. Then the layer is irradiated by rotor track-wise scanning a beam of an Ar ion laser, of a frequency doubled Nd:YAG laser, of a $CO_2$ laser or of a laser diode (wavelength below 940 nm) and in an overlapping manner with a degree of overlap ranging from 2% to 60%. Overlapping should be effected such that a part of the coarse grained regions produced by a preceding scanning row or track is remelted. A larger overlap leads to larger crystallites. According to the observations made by the inventors, a saturation is reached at an overlapping degree of about 60% where the crystallites do not further grow.

The scanning rate of the laser beam is in the range 0.1 to 50 cm/s, preferably 1 to 10 cm/s. The laser intensity is adjusted to values between 8 and approximately 160 $kW/cm^2$. The lower intensity range is to be used at low scanning rate, the higher range at high scanning rate.

Beam dimensions or diameter values in scanning direction of 50 to 500 μm have been used together with the mentioned ranges of scanning rates. Generally, it is true that, at higher beam diameters in scanning direction, the scanning rate is correspondingly raised such that each point of the layer is irradiated for 10 μs to several ms. By doing so, the melting duration should be in the range of 0.1 to 10 ms.

During laser irradiation, the substrate is heated to a temperature of 400 to 700° C. by a heating means.

During irradiation, the layer is doped by diffusion of boron or phosphorus from the glass substrate but may be additionally doped during deposition by adding doping gaseous dopands with known methods. On top of this layer, further amorphous silicon is deposited on the total area or on the total area except of the region where the metal contact is applied, using known methods. This deposition is continued until the desired thickness of the absorber layer is reached wherein, whenever a layer of 5 to 200 nm of silicon has newly been deposited, this layer is irradiated by pulses of a homogenized excimer laser. By irradiation using a fluence (energy density) in the range of 200 to 800 $mJ/cm^2$, preferably 450 to 800 $m/cm^2$, the layer is crystallized such that the crystal structure of the layer beneath is continued epitaxially. Depending on the ratio of the area to be deposited and the area being irradiated by the excimer laser pulse, which area depends on the pulse energy of the laser, crystallization is epitaxially effected by a single pulse or by several pulses, respectively. This is achieved by scanning the beam of the excimer laser across the deposited substrate such that the irradiated areas join each other or touch. By diffusion during the irradiation with the excimer laser, a doping profile showing a receding or decreasing concentration is generated within the absorber layer. However, additional doping during deposition can be applied.

The following emitter layer with a rough surface is produced by depositing an amorphous silicon layer 5 to 100 nm thick, preferably 20 to 100 nm thick, on top of the absorber layer. This layer is n-doped during deposition (p-doped in the alternative cell design) and/or is subsequently covered by a layer containing dopands. Furthermore, the layer is then irradiated by a beam of a pulsed UV laser, e.g. an excimer laser, with a fluence ranging from 150 to 800 mJ/cm$^2$ in an analog manner to the process mentioned in the foregoing part of description. To this end, a beam of an excimer laser is stepwise scanned across the deposited substrate. Depending on the laser fluence, the multicrystalline crystal structure of the absorber is continued or, in case of lower fluence values, a fine grained microcrystalline layer is produced. This layer is covered by a metal layer, preferably aluminum with a thickness ranging from 100 nm to several μm.

If the absorber layer and the following layers were deposited onto the whole area, then the layer system or stack is removed by etching or by laser ablation down to layer b1 in a region where the metal contact will be applied to the highly conducting seed layer b1. The metal contacts are be applied by screen printing or other conventional methods.

The substrate may be a flat glass plate with a soft point preferably below 600° C. In an alternative embodiment, the glass is roughened or structured on the side where the silicon layers are deposited, so that light scattering occurs and the amount of light reflection at the glass/silicon interface is reduced. The thickness of the glass substrate preferably ranges from 0.4 to 10 mm.

In a first embodiment, the whole multicrystalline silicon layer consists of grains with a lateral size exceeding the total thickness of seed layer, absorber layer, and emitter layer together. Therefore, there are no grain boundaries running parallel to the layer and, in this manner, would cross the direction of current. Instead, each one of the grain boundaries run throughout the entire layer from the substrate to the emitter surface.

In a second embodiment, only the p-doped part of the multicrystalline layer consists of these large grains. The n-doped emitter layer consists of crystallites in the range of 5 to 500 nm in size leading to a surface roughness in the range of the wavelength of light.

Of the numerous possible embodiments of the cell according to the present invention, and the production methods thereof, two concrete examples are presented in the following:

EXAMPLE I

Method Step 1

A 200 nm thick a-Si:H layer with a hydrogen content of 3 at % is deposited by a standard CVD process onto a borosilicate glass containing 15 wt % $B_2O_3$.

Method Step 2

A 200 nm thick p$^+$-doped multicrystalline seed layer is produced by: irradiating the a-Si:H layer with a Nd:YAG laser (cw, frequency doubled, wavelength 532 nm) of gaussian beam cross section being 80 μm wide and with a laser power of 3 W (corresponding to an irradiation intensity or power density of 60 kW/cm$^2$) using a scanning rate of the laser beam relative to the layer of 5 cm/s and an overlapping degree between consecutive rows of 40%. During irradiation, the substrate is maintained at a temperature of 600° C., for example, by lamp irradiation or by other conventional heating means.

Method Step 3

An absorber layer 5 μm thick is produced onto the seed layer by continuous deposition of p-doped a-Si using a plasma enhanced CVD process with diborane added. Whenever 30 nm have been deposited in this manner, the layer is irradiated by a pulsed excimer laser using the following parameters: wavelength 248 nm, pulse duration 30 ns, fluence 500 mJ/cm$^2$. If the deposited a-Si layer contains hydrogen then a double pulse technique is applied. i.e. 0.01 s before the above defined laser pulse, hydrogen is expelled by means of an excimer laser pulse with a fluence of 150 mJ/cm$^2$. The substrate temperature is 400° C. In this example, a region for later contacting of the seed layer is exempt from deposition when applying the absorber layer.

Method Step 4

The emitter layer is produced by depositing a n-doped a-Si layer 30 nm thick by means of a CVD process with phosphine added as a doping gas and an irradiation as described in Step 3.

Method Step 5

Contacting is performed by applying a large area metal layer onto the emitter and applying metal strips onto the p$^+$ seed layer at the non-deposited regions, both by screen printing.

EXAMPLE II

Method Step 1

A 400 nm thick a-Si:H layer is deposited according to the method mentioned in Example 1, Step 1.

Method Step 2

A 400 nm thick p$^+$-doped multicrystalline seed layer is produced by irradiating the a-Si:H layer by a diode laser (cw, wavelength 806 nm), with gaussian beam cross section with a beam diameter of 400 μm, a laser power of 14 W (corresponding to an irradiation intensity or power density of 12 kW/cm$^2$), a scanning rate 0.5 cm/s relative to the layer and with an overlap of scanning rows of 40%. During deposition, the substrate is again heated to 600° C.

Method Step 3

An absorber layer 5 μm thick is produced by continuously depositing a-Si by a plasma enhanced CVD process onto the seed layer. Whenever 20 nm layer thickness have been deposited, an irradiation with an excimer laser pulse is applied with parameters: wavelength 248 nm, pulse duration 30 nm, fluence 450 mJ/cm$^2$. Other details are as in Example I, Step 3:

Method Step 4

An emitter layer 20 nm thick is produced by the method defined in Example I, Step 4

Method Step 5

Step 5 is the same as in Example I.

In the Examples, a substrate heating to achieve a raised substrate temperature was used in order to limit the incorporation of hydrogen into the amorphous layers. One may work at lower temperature down to room temperature as well. In this case, additional UV laser irradiation with lower fluence values is applied for expelling hydrogen, which is known per se.

What is claimed is:

1. Multicrystalline laser crystallized silicon thin film solar cell on a glass substrate (a), configured for illumination from the substrate side, comprising:
   a laser crystallized multicrystalline silicon layer (b1,b2) being at least 2 µm thick whose first lower layer region (b1) which is situated on the substrate (a) and serves as seed layer and transparent electrode as well, is p-doped, and whose second layer region (b2) opposite from the substrate is epitaxially crystallized on said seed layer, has a lower p-doping in comparison to the seed layer and serves as absorber layer, wherein the lateral edge size of the crystallites in the multicrystalline layer (b1,b2) exceeds the thickness of this layer and wherein the grain boundaries of the crystallites extend throughout said layer (b1,b2);
   a laser crystallized n-doped silicon layer (c) which is provided above said silicon layer (b1, b2) and which serves as an emitter; and
   a reflecting contact layer (Al) as an upper electrode on top of the emitter layer (c).

2. The solar cell of claim 1, in which the emitter layer (c) has a thickness of 5 to 100 nm and is designed such that the large crystallites of the laser crystallized multicrystalline silicon layer comprising said seed layer (b1) and said absorber layer (b2) continuously extend throughout the emitter layer (c).

3. The solar cell of claim 1, in which the emitter layer (c) has a thickness of 5 to 100 nm and is designed such that the size of the crystallites of the emitter layer range from 5 to 500 nm.

4. The solar cell of claim 1 in which:
   the seed layer (b1) has a thickness of 150 nm to 1.5 µm and a doping level of $10^{18}$ to $6 \times 10^{20}$ cm$^{-3}$ dopand atoms,
   the absorber layer (b2) has a thickness of 1 µm to a maximum thickness of about 30 µm and a doping level between $10^{15}$ to $10^{18}$ cm$^{-3}$ dopand atoms which doping is homogeneous or, starting from the interface at the seed layer, gradually decreases towards the emitter layer, and that
   the emitter layer (c) has a doping level of about $10^{18}$ to $2 \times 10^{21}$ cm$^{-3}$ dopand atoms.

5. The solar cell of claim 1 in which the p-dopand is boron and a dopand providing substrate provided for this purpose is a boron containing substrate such as borosilicate glass.

6. The solar cell of claim 1 in which the reflecting contact layer is a highly reflecting metal layer (Al), preferably aluminum or silver.

7. The solar cell of claim 1 in which the seed layer (b1) acting as a lower electrode is, within exposed areas of the seed layer, contacted by metal strips (Al).

8. Multicrystalline laser crystallized silicon thin film solar cell on a glass substrate (a), configured for illumination from the substrate side, comprising:
   a laser crystallized multicrystalline silicon layer (b1,b2) being at least 2 µm thick whose first lower layer region (b1) which is situated on the substrate (a) and serves as seed layer and transparent electrode as well, is n-doped, and whose second layer region (b2) opposite from the substrate is epitaxially crystallized on said seed layer, has a lower n-doping in comparison to the seed layer and serves as absorber layer, wherein the lateral edge size of the crystallites in the multicrystalline layer (b1,b2) exceeds the thickness of this layer and wherein the grain boundaries of the crystallites extend throughout said layer (b1,b2);
   a laser crystallized p-doped silicon layer (c) which is provided above said silicon layer (b1, b2) and which serves as an emitter; and
   a reflecting contact layer (Al) as an upper electrode on top of the emitter layer (c).

9. The solar cell of claim 8, in which the emitter layer (c) has a thickness of 5 to 100 nm and is designed such that the large crystallites of the laser crystallized multicrystalline silicon layer comprising said seed layer (b1) and said absorber layer (b2) continuously extend throughout the emitter layer (c).

10. The solar cell of claim 8, in which the emitter layer (c) has a thickness of 5 to 100 nm and is designed such that the size of the crystallites of the emitter layer range from 5 to 500 nm.

11. The solar cell of claim 8 in which:
    the seed layer (b1) has a thickness of 150 nm to 1.5 µm and a doping level of $10^{18}$ to $6 \times 10^{20}$ cm$^{-3}$ dopand atoms,
    the absorber layer (b2) has a thickness of 1 µm to a maximum thickness of about 30 µm and a doping level between $10^{15}$ to $10^{18}$ cm$^{-3}$ dopand atoms which doping is homogeneous or, starting from the interface at the seed layer, gradually decreases towards the emitter layer, and that
    the emitter layer (c) has a doping level of about $10^{18}$ to $2 \times 10^{21}$ cm$^{-3}$ dopand atoms.

12. The solar cell of claim 8 in which the p-dopands are provided as phosphorus in the layers and the dopand providing substrate provided for this purpose is a phosphorus containing substrate.

13. The solar cell of claim 8 in which the reflecting contact layer is a highly reflecting metal layer (Al), preferably aluminum or silver.

14. The solar cell of claim 8 in which the seed layer (b1) acting as a lower electrode is, within exposed areas of the seed layer, contacted by metal strips (Al).

15. A method for producing a multicrystalline laser crystallized silicon thin film solar cell on a glass substrate, configured for illumination from the substrate side, comprising: a laser crystallized multicrystalline silicon layer being at least 2 µm thick whose first lower layer region which is situated on the substrate and serves as seed layer and transparent electrode as well, is p-doped, and whose second layer region opposite from the substrate is epitaxially crystallized on said seed layer, has a lower p-doping in comparison to the seed layer and serves as absorber layer, wherein the lateral edge size of the crystallites in the multicrystalline layer exceeds the thickness of this layer and wherein the grain boundaries of the crystallites extend throughout said layer; a laser crystallized n-doped silicon layer which is provided above said silicon layer and which serves as an emitter; and a reflecting contact layer as an upper electrode on top of the emitter layer;
    the method comprising the following steps:
    a) an amorphous or microcrystalline silicon layer is deposited onto a glass substrate, said silicon layer is crystallized to become said multicrystalline seed layer by means of a cw (continuous wave) laser with a wavelength in the visible or near infrared spectral range, in which seed layer doping is effected by diffusion of dopands from the substrate and/or by adding doping gases during deposition, b) said absorber layer is deposited and simultaneously stepwise epitaxially crystallized by laser irradiation in such a manner that, whenever a fraction of the absorber layer thickness has been deposited, an irradiation with a pulsed UV laser beam is applied, and that a doping is achieved by diffusion of dopands from the seed layer during irradiation and/or by adding doping gases during deposition, wherein the produced thickness of the multicrystalline layer consisting of said seed and of said absorber layers is at least 2 μm, c) the emitter layer is deposited onto the absorber layer as an amorphous or as a microcrystalline silicon layer, the crystallisation being effected by means of a pulsed UV laser, and doping being achieved by adding doping gases during deposition and/or applying an additional layer containing dopands onto the emitter layer and introducing the dopands into the emitter by laser irradiation, d) a reflecting layer is deposited onto the emitter layer as contacting layer, and contact portions are provided on exposed portions of the seed layer or on seed layer portions to be exposed beforehand.

16. The method of claim 15 in which said thickness fraction of the absorber layer of step b) is adjusted in a range of 5 to 200 nm.

17. The method of claim 15 in which the layer which is converted by laser crystallization into the seed layer is deposited as amorphous hydrogen containing silicon layer or as amorphous hydrogen free silicon layer by known methods being selected from Plasma-CVD, electron beam evaporation and hot wire CVD, which methods are also used for deposition of the absorber and emitter layers.

18. The method of claim 15 in which:
step a) is performed with a scanning rate of the cw (continuous wave) laser beam across the seed layer of 0.1 to 50 cm/s and with a power density of the laser beam of 8 to 160 kW/cm$^2$, with the low power range being applied in combination with low scanning rates and the high power range being applied in combination with high scanning rates, whereby an overlapping degree between overlapping scanning rows of 2% and 60% is used for crystallization, wherein
step b) is performed with a fluence of the UV laser ranging from 200 to 800 mJ/cm$^2$, and
step c) is performed with a fluence of the UV laser ranging from 150 to 800 mJ/cm$^2$ whereby the size of the crystallites increases with increasing fluence.

19. The method of claim 15 in which during process step a), the substrate is heated to a temperature between approximately 400 and 700° C., and, during process steps b) and c), the substrate is heated to a temperature between 20 and 600° C.

20. A method for producing a multicrystalline laser crystallized silicon thin film solar cell on a glass substrate, configured for illumination from the substrate side, comprising: a laser crystallized multicrystalline silicon layer being at least 2 μm thick whose first lower layer region which is situated on the substrate and serves as seed layer and transparent electrode as well, is n-doped, and whose second layer region opposite from the substrate is epitaxially crystallized on said seed layer, has a lower n-doping in comparison to the seed layer and serves as absorber layer, wherein the lateral edge size of the crystallites in the multicrystalline layer exceeds the thickness of this layer and wherein the grain boundaries of the crystallites extend throughout said layer; a laser crystallized p-doped silicon layer which is provided above said silicon layer and which serves as an emitter; and a reflecting contact layer as an upper electrode on top of the emitter layer; the method comprising the following steps:

a) an amorphous or microcrystalline silicon layer is deposited onto a glass substrate, said silicon layer is crystallized to become said multicrystalline seed layer by means of a cw (continuous wave) laser with a wavelength in the visible or near infrared spectral range, in which seed layer doping is effected either by diffusion of dopands from the substrate and/or by adding doping gases during deposition, b) said absorber layer is deposited and simultaneously stepwise epitaxially crystallized by laser irradiation in such a manner that, whenever a fraction of the absorber layer thickness has been deposited, an irradiation with a pulsed UV laser beam is applied, and that a doping is achieved by diffusion of dopands from the seed layer during irradiation and/or by adding doping gases during deposition, wherein the produced thickness of the multicrystalline layer consisting of said seed and of said absorber layers is at least 2 μm, c) the emitter layer is deposited onto the absorber layer as an amorphous or as a microcrystalline silicon layer, the crystallisation being effected by means of a pulsed UV laser, and doping being achieved by adding doping gases during deposition and/or applying an additional layer containing dopands onto the emitter layer and introducing the dopands into the emitter by laser irradiation, d) a reflecting layer is deposited onto the emitter layer as contacting layer, and contact portions are provided on exposed portions of the seed layer or on seed layer portions to be exposed beforehand.

21. The method of claim 20 in which said thickness fraction of the absorber layer of step b) is adjusted in a range of 5 to 200 nm.

22. The method of claim 20 in which the layer which is converted by laser crystallization into the seed layer is deposited as amorphous hydrogen containing silicon layer or as amorphous hydrogen free silicon layer by known methods selected from Plasma-CVD, electron beam evaporation and hot wire CVD, which methods are also used for deposition of the absorber and emitter layers.

23. The method of claim 20 in which:
step a) is performed with a scanning rate of the cw (continuous wave) laser beam across the seed layer of 0.1 to 50 cm/s and with a power density of the laser beam of 8 to 160 kW/cm$^2$, with the low power range being applied in combination with low scanning rates and the high power range being applied in combination with high scanning rates, whereby an overlapping degree between overlapping scanning rows of 2% and 60% is used for crystallization, wherein
step b) is performed with a fluence of the UV laser ranging from 200 to 800 mJ/cm$^2$, and
step c) is performed with a fluence of the UV laser ranging from 150 to 800 mJ/cm$^2$ whereby the size of the crystallites increases with increasing fluence.

24. The method of claim 20, in which during process step a), the substrate is heated to a temperature between approximately 400 and 700° C., and, during process steps b) and c), the substrate is heated to a temperature between 20 and 60020 C.

* * * * *

UNITED STATES PATENT AND TRADEMARK OFFICE
CERTIFICATE OF CORRECTION

PATENT NO. : 7,091,411 B2
APPLICATION NO. : 10/344910
DATED : August 15, 2006
INVENTOR(S) : Falk et al.

It is certified that error appears in the above-identified patent and that said Letters Patent is hereby corrected as shown below:

Column 3, line 18, "multcrystalline" should be changed to -- multicrystalline --;

Column 4, line 61, "With" should be changed to -- with --;

Column 4, line 64, "paramenters" should be changed to -- parameters --;

Column 5, line 50, "crystall" should be changed to -- crystal --;

Column 6, line 30, "rotor" should be changed to -- row-or --;

Signed and Sealed this

Fifth Day of December, 2006

JON W. DUDAS
*Director of the United States Patent and Trademark Office*